US010782248B2

United States Patent
Quan et al.

(10) Patent No.: US 10,782,248 B2
(45) Date of Patent: Sep. 22, 2020

(54) AUTOMATIC DETECTION DEVICE AND METHOD FOR DETECTING SURFACE DETECTS OF LARGE CALIBER CAMBERED OPTICAL ELEMENT

(71) Applicant: The Institute of Optics and Electronics, The Chinese Academy of Sciences, Sichuan (CN)

(72) Inventors: Haiyang Quan, Sichuan (CN); Fuchao Xu, Sichuan (CN); Taotao Fu, Sichuan (CN); Xiaochuan Hu, Sichuan (CN); Gaofeng Wu, Sichuan (CN); Xi Hou, Sichuan (CN); Fan Wu, Sichuan (CN); Sheng Li, Sichuan (CN)

(73) Assignee: The Institute of Optics and Electronics, The Chinese Academy of Sciences, Sichuan (CN)

( * ) Notice: Subject to any disclaimer, the term of this patent is extended or adjusted under 35 U.S.C. 154(b) by 0 days.

(21) Appl. No.: 16/676,779

(22) Filed: Nov. 7, 2019

(65) Prior Publication Data

US 2020/0150055 A1    May 14, 2020

(30) Foreign Application Priority Data

Nov. 9, 2018   (CN) .......................... 2018 1 1330664

(51) Int. Cl.
*G01N 21/95* (2006.01)
*G06T 7/00* (2017.01)
(Continued)

(52) U.S. Cl.
CPC ..... *G01N 21/9501* (2013.01); *G01N 21/8806* (2013.01); *G01N 21/94* (2013.01);
(Continued)

(58) Field of Classification Search
CPC ............ G01N 21/956; G01N 21/9501; G01N 21/8806; G01N 21/95607; G06K 7/10732
(Continued)

(56) References Cited

U.S. PATENT DOCUMENTS

| 2004/0095575 | A1* | 5/2004 | Woo ................... G01N 21/9501 356/300 |
| 2005/0045821 | A1* | 3/2005 | Noji ..................... G01N 23/225 250/311 |

(Continued)

*Primary Examiner* — Hung Nguyen
(74) *Attorney, Agent, or Firm* — Schwegman Lundberg & Woessner, P.A.

(57) ABSTRACT

Embodiments of the present disclosure relate to a measuring method and device for measuring surface defects of a cambered optical element, which belongs to the field of photoelectric detection technology. The device includes a sensor measuring head, a rotatable workpiece table, an automatic sampling device, and a spraying device. The sensor measuring head includes an illumination sub-system and a line scan imaging sub-system, the illumination sub-system provides an illumination of high uniformity and high brightness for a surface of a sample to be detected, the rotatable workpiece table and the imaging sub-system are configured for performing a ring belt scanning and a high resolution scatter imaging to the defects on an optical surface region. The automatic sampling device is used as a mechanical arm in an automatic production for automatically clamping optical elements; the spraying device is activated once foreign matters such as dust and impurities are detected on the surface, so as to accurately remove false defects such as dust and impurities on the surface of the piece to be detected. Embodiments of the present disclosure effectively solve the problem that the surface defect detection of the large caliber optical element is difficult and the
(Continued)

efficiency thereof is low, and can quickly measure surface defects of a large caliber planar, spherical and cambered optical element.

6 Claims, 3 Drawing Sheets

(51) Int. Cl.
- *G01N 21/94* (2006.01)
- *G01N 21/956* (2006.01)
- *H01L 21/66* (2006.01)
- *G06K 7/10* (2006.01)
- *G01N 21/88* (2006.01)

(52) U.S. Cl.
CPC ... *G01N 21/95607* (2013.01); *G06K 7/10732* (2013.01); *G06T 7/001* (2013.01); *H01L 22/12* (2013.01); *G06T 2207/30148* (2013.01)

(58) Field of Classification Search
USPC ....................................................... 356/237.2
See application file for complete search history.

(56) References Cited

U.S. PATENT DOCUMENTS

| | | | | |
|---|---|---|---|---|
| 2005/0104017 A1* | 5/2005 | Kimba | .................. | G06T 7/001 250/559.07 |
| 2008/0212049 A1* | 9/2008 | Fukutomi | ........... | G03F 7/70991 355/30 |
| 2011/0141272 A1* | 6/2011 | Uto | .................... | G01N 21/9501 348/135 |

\* cited by examiner

AUTOMATIC DETECTION DEVICE AND METHOD FOR DETECTING SURFACE DETECTS OF LARGE CALIBER CAMBERED OPTICAL ELEMENT

CROSS-REFERENCE TO RELATED APPLICATION

This application claims priority of Chinese Patent Application No. 201811330664.9 filed on Nov. 9, 2018 in China National Intellectual Property Administration, the disclosure of which is incorporated herein by reference in entirety.

TECHNICAL FIELD

Embodiments of the present disclosure belong to the field of advanced optical manufacture and detection, and relate to an optical detection device, in particular, to an automatic detection device and method for surface defects of a cambered optical element.

BACKGROUND

With the continuous development of advanced optical manufacturing technology, application fields such as microelectronics equipment, aeronautics and astronautics, precise measurement and laser systems have put forward higher technical requirements for surface processing quality of precise optical elements of some core components. Surfaces of cambered optical elements often have various defects (for example, scratches, dents, cracks, chipping, etc.) after being burnished and polished. These defects not only reduce the user experience, but also affect the performance of the optical system.

The detection of surface defects of the large caliber cambered optical element still seriously depends on manual qualitative detection. At present, the mainstream manual visual detection is not only inefficient, but also has poor accuracy due to subjective judgment, which seriously restricts the automation process of the advanced optical manufacture. In recent years, machine vision-based defect detection technology has attracted the attention of researchers, however, the current method has low detection accuracy and needs long time, and therefore cannot meet the real-time detection requirements on current industrial sites. Moreover, the current method has no detection capability for the defects on cambered surfaces. Therefore, there is a need for a device and a method for automatically detecting surface defects of a large caliber cambered optical element, by using machine vision process to replace manual processes, so as to greatly improve detection efficiency and detection precision.

SUMMARY

The object of the present disclosure is to solve the problem raised in the above background, and to provide an automatic detection system and method for detecting surface defects of a large caliber cambered optical element.

The technical solutions of the present disclosure are as follows:

A system for measuring surface defects of a large caliber cambered optical element, comprising: a sensor sub-system, an imaging sub-system, an illumination sub-system, a large caliber optical element, a rotatable workpiece table, an automatic sampling device, a spraying device, and a guide rail, wherein the sensor sub-system, the imaging sub-system and the illumination sub-system constituting a measuring head are vertically mounted on the guide rail to realize multi-axis coordination of the large caliber optical element, including translations along X and Z axes and a swing movement around the X axis, to ensure that an optical axis of a sensor measuring head is always kept to be consistent with a normal of a surface of the large caliber optical element to be detected during a detection process; the large caliber optical element is placed on the workpiece table which is rotatable around the Z axis by 360 degrees, the measuring head cooperates with the rotatable workpiece table to achieve full caliber scanning measurement of surface defects of the large caliber optical element to be detected.

In some embodiments of the present disclosure, the illumination sub-system is of a multi-angle annular illumination sub-system distributed around the imaging sub-system, comprising LEDs or a laser source and an illumination optical sub-system, and each ring belt has a controllable illumination angle such that specular reflection images do not enter the imaging sub-system, while the sensor sub-system obtains scattered images of the defects.

In some embodiments of the present disclosure, the imaging sub-system comprises a high-resolution linear array lens, a high-resolution line array camera, and a high-speed data acquisition card connected to camera signals, and further comprises an optical modulation element such as a phase reticle, a holographic optical element or a microlens array for expanding a depth of field of the imaging sub-system.

In some embodiments of the present disclosure, the optical axis of the sensor measuring head is always kept to be consistent with the normal of the surface of the large caliber optical element to be detected during the detection process.

In some embodiments of the present disclosure, the sensor measuring head is adjusted to achieve focusing before measurement of each ring belt, so that the entire ring belt is clearly imaged on a camera sensor of the imaging sub-system in a depth of field.

In some embodiments of the present disclosure, the spraying device is configured to spray and clean the entire surface before each measurement; and the spraying device is configured to spray and remove dust at each location, which is accurately identified on an optical surface by a machine learning dust recognition algorithm, after each measurement.

According to another aspect of the present disclosure, there is provided a method for measuring surface defects of a large caliber cambered optical element by using the system according to any one of the above embodiments, comprising:

step 1: moving the guide rail in a multi-axis coordination manner, to make an imaging optical axis of the sensor measuring head, a sphere center of the large caliber optical element, and a rotating center of the rotatable workpiece table coincide with each other, obtaining an initial detection position of a sample to be detected;

step 2: according to an information of a caliber and a radius of curvature of the large caliber optical element to be detected, moving the measuring head to a first ring belt scanning position $N_1$ in the guide rail;

step 3: according to the information of the caliber and the radius of curvature of the large caliber optical element to be detected, controlling an incident angle of a light source of the illumination sub-system and simultaneously turning on an illumination source;

step 4: controlling the rotatable workpiece table to rotate at a constant speed while generating a line trigger signal by an encoder, and controlling by the line trigger signal a line array camera to take a picture;

step 5: realizing a scanning of the surface defects of n sub-aperture ring belts of the large caliber optical element to be detected by implementing the steps 2 to 4, and then splicing images of the ring belts by a processor to realize a full caliber detection of the surface defects of the large caliber optical element to be detected; and step 6: performing an evaluation and a digitization representation to images acquired by a data processing system.

The beneficial effects of the present disclosure over the prior art lie in:

The embodiments of the present disclosure utilizes a multi-angle annular light source with a controllable incident angle to uniformly irradiate a cambered surface, and scattered light from the surface defects of the optical element is imaged to the imaging sub-system in a dark field imaging manner. In this way, the contrast and the signal-to-noise ratio are greatly improved compared with the imaging in the traditional machine vision method. A line array camera and a rotatable workpiece table are used to perform a full caliber ring belt scanning to the large caliber cambered element, and therefore the detection precision and detection efficiency are also greatly improved.

DETAILED DESCRIPTION OF EMBODIMENTS

The present disclosure will be described in detail below with reference to the accompanying drawings and specific embodiments.

Figure 1:
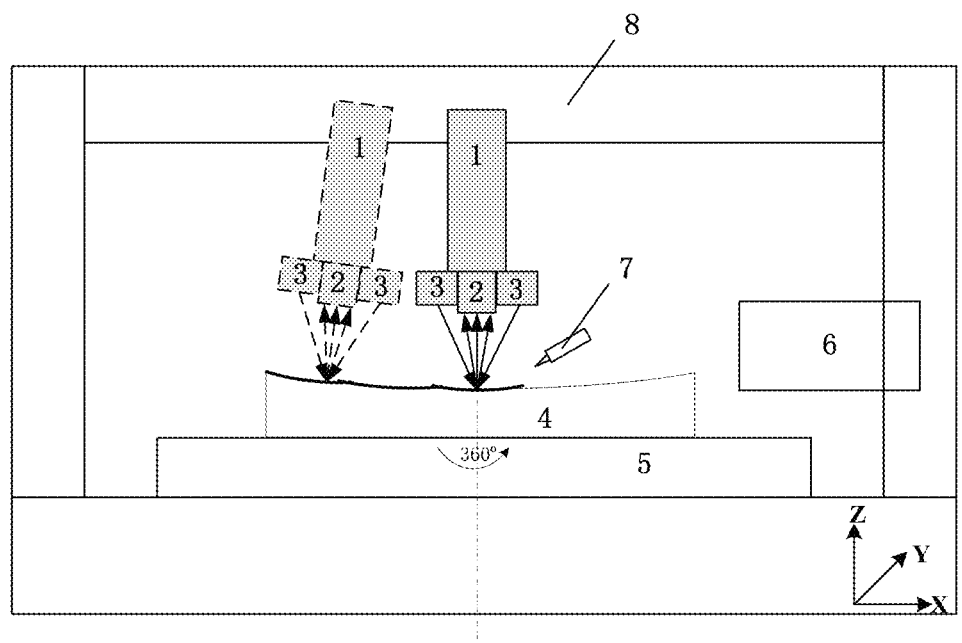
FIG. 1 is a schematic structural view of a detection device according to an embodiment of the present disclosure.

As shown in FIG. 1, in an embodiment of the present disclosure, a measuring system for measuring surface defects of a large caliber cambered optical element includes a sensor sub-system 1, an imaging sub-system 2, an illumination sub-system 3, a large caliber optical element 4, a rotatable workpiece table 5, an automatic sampling device 6, a spraying device 7, and a guide rail 8. The large caliber optical element 4 is placed on the workpiece table 5 which is rotatable around a Z axis by 360 degree, and a sensor measuring head 1 is vertically mounted on the guide rail 8 to realize multi-axis coordination of the large caliber optical element, including translations along X and Z axes and a swing movement around the X axis, to ensure that an optical axis of the sensor measuring head 1 is consistent with a normal of a surface of the large caliber optical element 4 to be detected during a detection process. Finally, the sensor measuring head 1 cooperates with the rotatable workpiece table 5 to achieve full caliber scanning measurement of surface defects of the large caliber optical element 4 to be detected.

The measurement process and detection steps of the device of the present disclosure are as follows:

Step 1: as shown in FIG. 1, moving the guide rail 8 in a multi-axis coordination manner, to make an imaging optical axis of the measuring head, a sphere center of the large caliber optical element 4, and a rotating center of the rotatable workpiece table 5 coincide with each other, obtaining an initial detection position of a sample to be detected;

Step 2: according to an information of a caliber and a radius of curvature of the large caliber optical element 4 to be detected, moving the measuring head to a first ring belt scanning position $N_1$ in the guide rail; Step 3: according to the information of the caliber and the radius of curvature of the large caliber optical element 4 to be detected, controlling an incident angle of a light source of the illumination sub-system 3 and simultaneously turning on an illumination source;

Step 4: controlling the rotatable workpiece table 5 to rotate at a constant speed while generating a line trigger signal by an encoder, and controlling by the line trigger signal a line array camera to take a picture;

Step 5: realizing a scanning of a plurality of sub-aperture ring belts of the surface defects of the large caliber optical element 4 to be detected by implementing the steps 2 to 4, and then splicing images of the ring belts by a processor to realize a full caliber detection of the surface defects of the large caliber optical element 4 to be detected.

Figure 2:
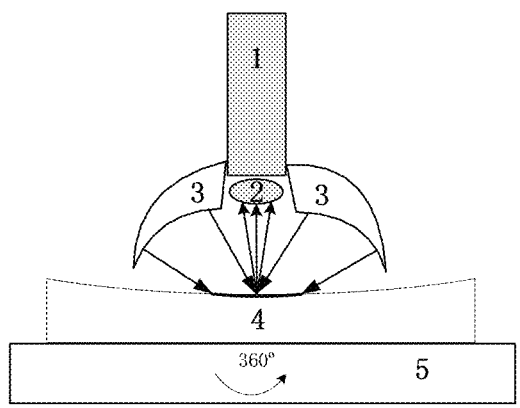
FIG. 2 is a schematic structural view of a measuring head according to an embodiment of the present disclosure.

The measuring head described in the step 1 comprises a sensor sub-system 1, an imaging sub-system 2 and an illumination sub-system 3, and the schematic structural view thereof is shown in FIG. 2. The illumination sub-system 3 is of a multi-angle annular illumination sub-system distributed around the imaging sub-system 2, including a light source and an illumination optical sub-system, and each ring belt has a controllable illumination angle such that specular reflection images do not enter the imaging sub-system 2, while the sensor sub-system 1 can obtain scattered images of the defects. The light source is an LED light source or a laser light source having a brightness sufficient to cause various defects on a surface of the large caliber optical element 4 to be visualized in the imaging sub-system 2.

The rotatable workpiece table 5 described in the step 4 is an electronically controlled rotatable table, and the end face jump during uniform rotation should not affect the focusing of the measuring head. The rotatable workpiece table 5 is controlled to rotate at a constant speed, meanwhile a line trigger signal is generated by an encoder, and the line array camera is controlled by the line trigger signal to take a picture, thereby obtaining the acquisition of the surface defects on the entire ring belt.

Figure 3:
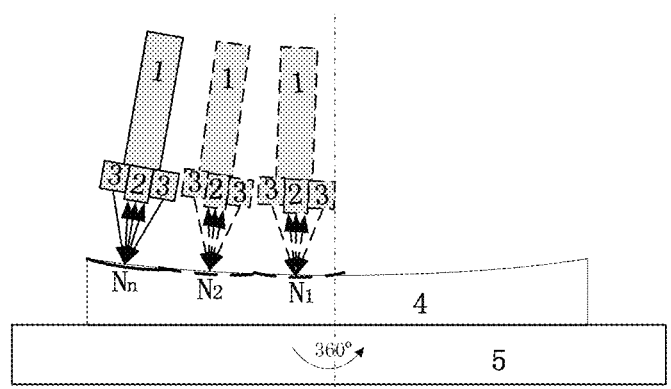
FIG. 3 is a schematic view showing a line scanning measurement process of a concave spherical element according to an embodiment of the present disclosure.
Figure 4:
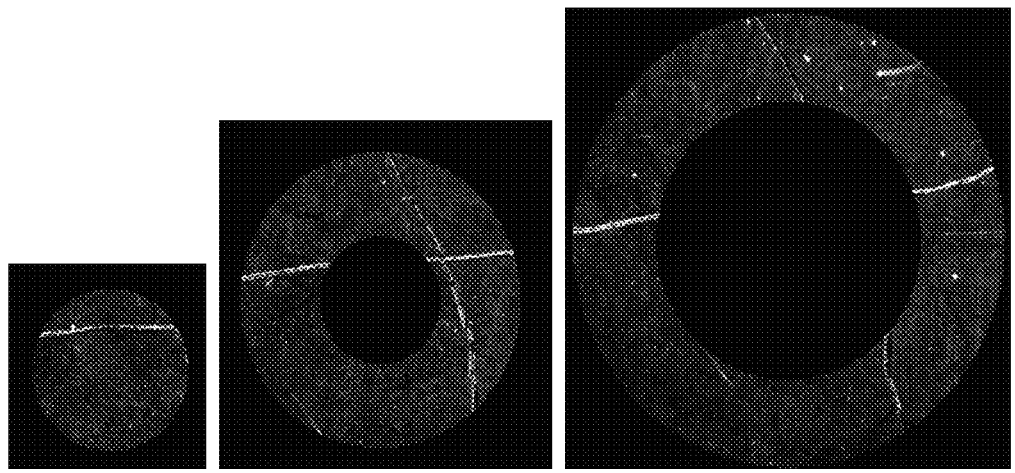
FIG. 4 is a view showing surface defects on three sub-aperture ring belts of a concave spherical element according to an embodiment of the present disclosure.

As shown in FIG. 3, it shows a scan and acquisition process of surface defects of the large caliber cambered optical element for a sub-aperture ring belt, which includes:

1-1. according to an information of a caliber and a radius of curvature of the large caliber optical element 4 to be detected, determining a sub-aperture scanning path and the number of ring belts;

1-2. controlling the measuring head by the guide rail to swing around the X axis and to translate along the X and Z axes, so that the optical axis of the measuring head is perpendicular to the surface ring belt $N_1$ of the large caliber optical element 4 to be detected;

1-3. rotating the rotatable workpiece table 5 at a constant speed while acquiring images by the sensor sub-system 1, to obtain an image of a first sub-aperture ring belt;

1-4. according to the determined sub-aperture ring belt scanning path, controlling the measurement head to swing around the X axis and to translate along the X and Z axes, to arrive at other sub-aperture positions, and obtaining images of i-th sub-aperture ring belts sequentially;

1-5. repeating the steps 1-2 and 1-3 until a no-missing acquisition of the information regarding the full caliber surface defects of the large caliber optical element 4 is completed. A view showing surface defects on three sub-aperture ring belts of a concave spherical element according to an embodiment of the present disclosure is as shown in FIG. 4.

Figure 5:
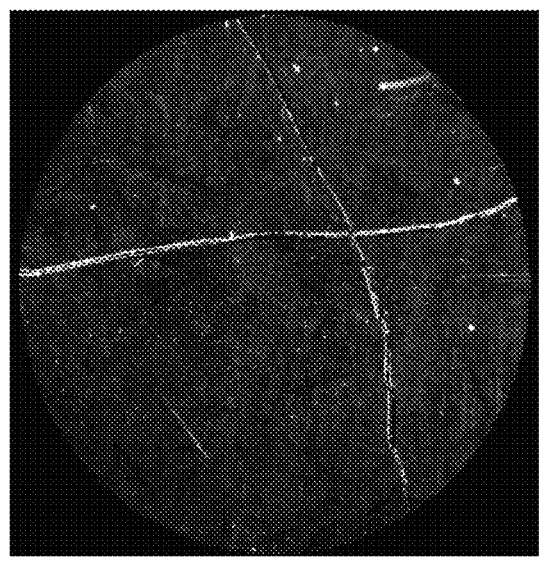
FIG. 5 is a panoramic image of surface defects of a concave spherical element according to an embodiment of the present disclosure.

1-6. performing an image processing and splicing to the acquired images of the sub-aperture ring belts, to obtain a panoramic image of the surface defects of the detected large caliber optical element 4. A panoramic image of surface defects of a concave spherical element according to an embodiment of the present disclosure is as shown in FIG. 5.

The method and the device have the advantages of simple structure, easy construction, low cost and short detection time, and they provide an effective testing means for measuring surface defects of large caliber cambered optical elements.

The above only refers to the specific embodiments of the present disclosure, but the scope of the present disclosure is not limited thereto. Any modification or replacement made by those skilled in the art within the technical scope of the present disclosure fall within the scope of the claims of the present disclosure.

What is claimed is:

1. A system for measuring surface defects of a large caliber cambered optical element, comprising:
    a sensor sub-system, an imaging sub-system, an illumination sub-system, a large caliber optical element, a rotatable workpiece table, an automatic sampling device, a spraying device, and a guide rail,
    wherein the sensor sub-system, the imaging sub-system and the illumination sub-system constituting a measuring head are vertically mounted on the guide rail to realize multi-axis coordination of the large caliber optical element, including translations along X and Z axes and a swing movement around the X axis, to ensure that an optical axis of a sensor measuring head is always kept to be consistent with a normal of a surface of the large caliber optical element to be detected during a detection process;
    the large caliber optical element is placed on the workpiece table which is rotatable around the Z axis by 360 degrees, the measuring head cooperates with the rotatable workpiece table to achieve full caliber scanning measurement of surface defects of the large caliber optical element to be detected,
    wherein the illumination sub-system is of a multi-angle annular illumination sub-system distributed around the imaging sub-system, comprising LEDs or a laser source and an illumination optical sub-system, and each ring belt has a controllable illumination angle such that specular reflection images do not enter the imaging sub-system, while the sensor sub-system obtains scattered images of the defects.

2. The system according to claim 1, wherein the imaging sub-system comprises a high-resolution linear array lens, a high-resolution line array camera, and a high-speed data acquisition card connected to camera signals, and further comprises an optical modulation element such as a phase reticle, a holographic optical element or a microlens array for expanding a depth of field of the imaging sub-system.

3. The system according to claim 1, wherein the optical axis of the sensor measuring head is always kept to be consistent with the normal of the surface of the large caliber optical element to be detected during the detection process.

4. The system according to claim 1, wherein the sensor measuring head is adjusted to achieve focusing before measurement of each ring belt; so that the entire ring belt is clearly imaged on a camera sensor of the imaging sub-system in a depth of field.

5. The system according to claim 1, wherein the spraying device is configured to spray and clean the entire surface before each measurement; and the spraying device is configured to spray and remove dust at each location, which is accurately identified on an optical surface by a machine learning dust recognition algorithm, after each measurement.

6. A method for measuring surface defects of a large caliber cambered optical element by using the system according to claim 1, comprising:
    step 1: moving the guide rail in a multi-axis coordination manner, to make an imaging optical axis of the sensor measuring head, a sphere center of the large caliber optical element, and a rotating center of the rotatable workpiece table coincide with each other, obtaining an initial detection position of a sample to be detected;
    step 2: according to an information of a caliber and a radius of curvature of the large caliber optical element to be detected, moving the measuring head to a first ring belt scanning position $N_1$ in the guide rail;
    step 3: according to the information of the caliber and the radius of curvature of the large caliber optical element to be detected, controlling an incident angle of a light source of the illumination sub-system and simultaneously turning on an illumination source;
    step 4: controlling the rotatable workpiece table to rotate at a constant speed while generating a line trigger signal by an encoder, and controlling by the line trigger signal a line array camera to take a picture;
    step 5: realizing a scanning of the surface defects of n sub-aperture ring belts of the large caliber optical element to be detected by implementing the steps 2 to 4, and then splicing images of the ring belts by a processor to realize a full caliber detection of the surface defects of the large caliber optical element to be detected; and
    step 6: performing an evaluation and a digitization representation to images acquired by a data processing system.

* * * * *